(12) United States Patent
Oana

(10) Patent No.: US 7,348,598 B2
(45) Date of Patent: Mar. 25, 2008

(54) THIN FILM TRANSISTOR AND LIQUID CRYSTAL DISPLAY DEVICE USING THE SAME

(75) Inventor: Yasuhisa Oana, Yokohama (JP)

(73) Assignee: LG.Philips LCD Co., Ltd., Seoul (KR)

( * ) Notice: Subject to any disclaimer, the term of this patent is extended or adjusted under 35 U.S.C. 154(b) by 120 days.

(21) Appl. No.: 11/413,107

(22) Filed: Apr. 28, 2006

(65) Prior Publication Data

US 2006/0262239 A1  Nov. 23, 2006

(30) Foreign Application Priority Data

Apr. 28, 2005  (JP)  ............... 2005-132714

(51) Int. Cl.
  *H01L 29/04*  (2006.01)
  *H01L 29/10*  (2006.01)
  *H01L 31/036*  (2006.01)
  *H01L 31/0376*  (2006.01)
  *H01L 31/20*  (2006.01)

(52) U.S. Cl. ............... 257/57; 257/52; 257/58; 257/59; 257/60; 257/61; 257/63; 257/66; 257/67; 257/68; 257/69; 257/70; 257/71; 257/72; 257/73; 257/E29.151

(58) Field of Classification Search .......... 257/52, 257/57–61, 63, 66–73, E29.151
See application file for complete search history.

(56) References Cited

U.S. PATENT DOCUMENTS

| 5,017,983 | A | * | 5/1991 | Wu | .............. | 257/61 |
| 5,053,347 | A | * | 10/1991 | Wu | .............. | 438/157 |
| 5,173,753 | A | * | 12/1992 | Wu | .............. | 257/347 |
| 5,196,911 | A | * | 3/1993 | Wu | .............. | 257/53 |
| 5,355,002 | A | * | 10/1994 | Wu | .............. | 257/57 |
| 5,656,526 | A | * | 8/1997 | Inada et al. | .............. | 430/314 |
| 6,064,091 | A | * | 5/2000 | Deane et al. | .............. | 257/347 |
| 2005/0082492 | A1 | * | 4/2005 | Lin et al. | .............. | 250/370.14 |

FOREIGN PATENT DOCUMENTS

JP  2004-048036  12/2004
KR  10-2005-0006340  1/2005

* cited by examiner

*Primary Examiner*—Ida M. Soward
(74) *Attorney, Agent, or Firm*—McKenna Long & Aldridge LLP

(57) ABSTRACT

A TFT, in which source and drain electrodes having concentric circular shapes are formed, reduces an OFF current caused by a leakage current and optimizes an ON current and a stray capacitance between gate and source electrodes. The TFT includes a gate electrode formed on a substrate; and source and drain electrodes obtained by sequentially forming a gate insulating film, an intrinsic amorphous silicon layer, and an n+ amorphous silicon layer on the gate electrode, wherein the source and drain electrodes have circular shapes. One of the source and drain electrodes is disposed at the center, and the other one of the source and drain electrodes having a concentric circular shape surrounds the former. A channel region may be formed between the source and drain electrodes; and an area of an effective stray capacitance may be less than 150 $\mu m^2$. A ratio of a width of a channel to a length of the channel may be more than 4.5 and a filling capacity index to the effective stray capacitance may be less than 50.

10 Claims, 12 Drawing Sheets

THIN FILM TRANSISTOR AND LIQUID CRYSTAL DISPLAY DEVICE USING THE SAME

This application claims the benefit of Japanese Patent Application No. JP-2005-00132714, filed on Apr. 28, 2005, which is hereby incorporated by reference for all purposes as if fully set forth herein.

BACKGROUND OF THE INVENTION

1. Field of the Invention

The present invention relates to a thin film transistor (TFT). More particularly, the present invention relates to a TFT, in which source and drain electrodes having concentric circular shapes are formed. The TFT may reduce a leakage current or an OFF current caused by a parasitic TFT capacitance and optimize an ON current and a stray capacitance between gate and source electrodes.

2. Discussion of the Related Art

Liquid crystal display devices include flat display devices. Flat display devices are lightweight and have a thin profile and a low power consumption rate. Because of these characteristics, the flat display device is used in various fields.

In a liquid crystal display device, switching elements are formed at pixels, and the pixels are respectively operated by the switching elements. TFTs are used as the switching elements.

FIG. 1A is a top view of a related art TFT used in a liquid crystal display device, and FIG. 1B is a sectional view taken along the line I-I' of FIG. 1A.

As shown in FIG. 1A, the related art TFT comprises ends of an amorphous silicon layer that protrude from source and drain electrodes and are formed on a gate electrode.

The ends of the amorphous silicon layer may cause several problems, such as difficulty in finishing fine shapes and controlling cleanliness. Also, a leakage current that is due to of a parasitic TFT with contaminants (for example, remaining resist and residue formed during a dry etching process) may be generated.

When the above leakage current is high, the ability to hold charges is deteriorated. Also, flickering of an image or an after-image occurs.

Further, when a stain due to leakage current occurs on a screen, a stain in the image due to gradation of light occurs.

In order to solve the above problems caused by the leakage current, various solutions for reducing leakage current in a TFT have been suggested.

For example, Japanese Patent Laid-open Publication No. 2004-48036 discloses TFTs having a low leakage current. FIGS. 2A and 2B respectively illustrate the related art TFTs disclosed by the Patent.

As shown in FIGS. 2A and 2B, electrodes having concentric circular shapes are disposed on active layers 504 and 508. Gate electrodes 502 and 506 respectively surround electrodes 501 and 505. Electrodes 503 and 507 respectively surround the gate electrodes 502 and 506. The electrodes 501 and 505 are disposed in different layers from the layers in which wiring metals of the gate electrodes 502 and 506 are disposed, and the electrodes 501 and 505 and the electrodes 503 and 507 are disposed in the same layers.

One of the electrodes 501 and 503 and one of the electrodes 505 and 507 serve as source electrodes, and the other one of the electrodes 501 and 503 and the other one of the electrodes 505 and 507 serve as drain electrodes.

According to the above structures, the related art TFTs do not include an amorphous silicon layer with protruding ends. Thus, a leakage current may be reduced.

Further, Korean Patent Laid-open Publication No. 10-2005-0006340 discloses a related art TFT having electrodes having concentric circular shapes.

FIG. 3A is a schematic view of the TFT, disclosed by the above Patent, which is disposed in a display panel, and FIG. 3B is a sectional view taken along the line VIIIb-VIIIb' of FIG. 3A.

Gate electrodes 124 and gate lines 121 are disposed on a substrate 110, and an intrinsic amorphous silicon layer 154 is formed thereon by interposing a gate insulating layer between the gate electrodes 124 and the intrinsic amorphous silicon layer 154. Then, circular electrodes 175 and electrodes 173 surrounding the circular electrodes 175 are disposed thereon such that the electrodes 175 and 173 are disposed in the same layer.

One of the electrodes 175 and 173 serves as a source electrode, and the other one of the electrodes 175 and 176 serves as a drain electrode.

The electrodes 175 and 173 have concentric circular shapes, thereby structurally removing protruded ends of the intrinsic amorphous silicon layer 154.

As described above, the related art TFTs do not include an amorphous silicon layer with protruded ends. Thus, leakage current may be reduced.

Further, the related art TFT causes a level shift of the electric potential of a different display electrode. The level shift is caused by a stray capacitance generated by overlapping between an electrode and a gate electrode of the related art TFT.

The amount of the level shift is in proportion to the stray capacitance. In order to prevent flickering of an image or occurrence of an after-image, the stray capacitance should be small and the distribution of the electrodes 183 should be narrow.

The above related art TFTs reduce leakage current, but cannot solve the level shift of the electric potential of the display electrode.

Accordingly, a technique for simultaneously reducing a leakage current and removing a level shift is required.

Further, in order to allow large-sized liquid crystal TVs, increase of an ON current is necessary. That is, a method for optimizing three factors, i.e., reduction of a leakage current, increase of an ON current, and decrease of a stray capacitance, is required.

SUMMARY OF THE INVENTION

Accordingly, the present invention is directed to a thin film transistor (TFT) and a liquid crystal display device using the same that substantially obviates one or more of the problems due to limitations and disadvantages of the related art.

An advantage of the present invention is to provide a TFT that reduces a leakage current and removes a level shift of the electric potential of a display electrode, and a method for manufacturing a liquid crystal display device using the same.

Another advantage of the present invention is to provide a TFT, in which a proper ON current for operating liquid crystal is supplied to a pixel circuit, and a method for manufacturing a liquid crystal display device using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a TFT includes a gate electrode formed on a substrate; and source and drain electrodes obtained by sequentially forming a gate insulating film, an intrinsic amorphous silicon layer, and an n+amorphous silicon layer on the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Figure 1A:
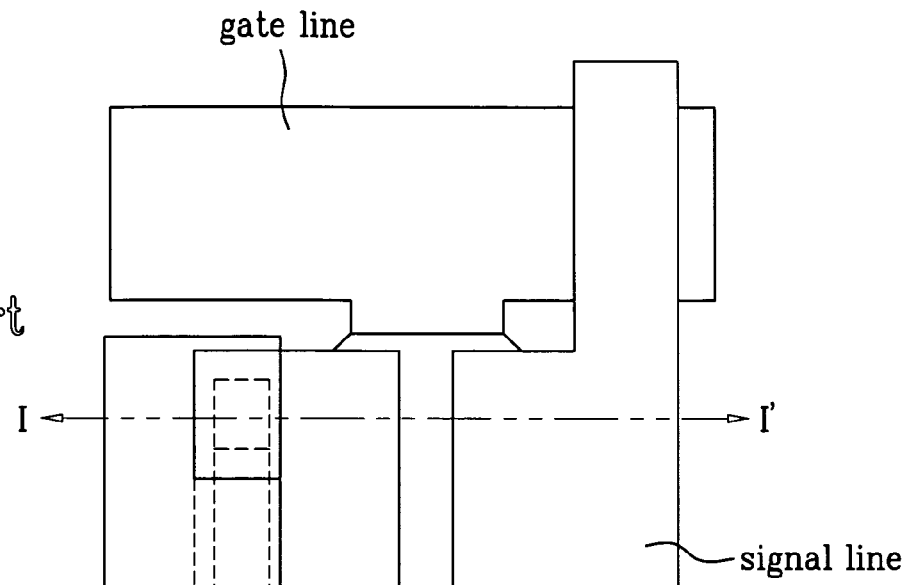
FIG. 1A is a top view of a related art TFT used in a liquid crystal display device.
Figure 1B:
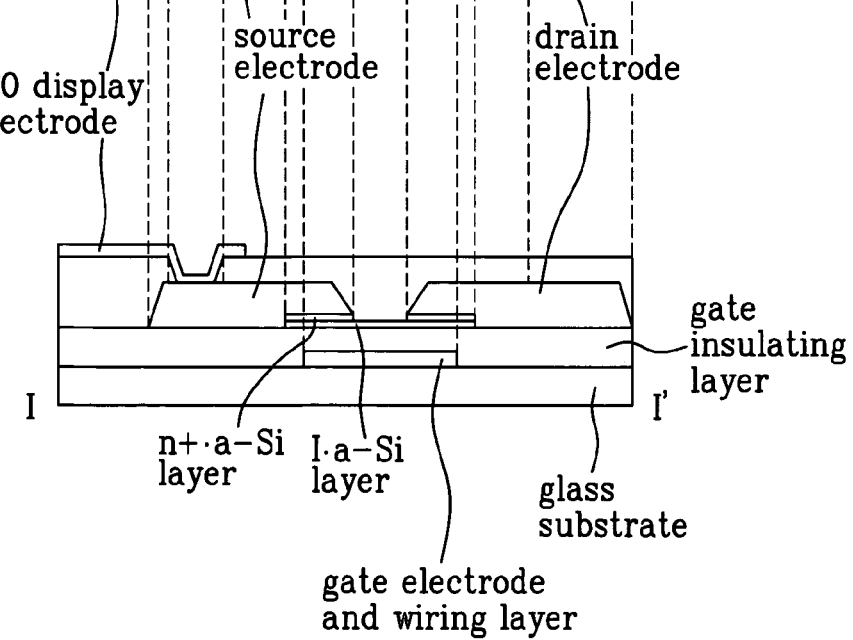
FIG. 1B is a sectional view taken along the line I-I' of FIG. 1A.
Figure 2A:
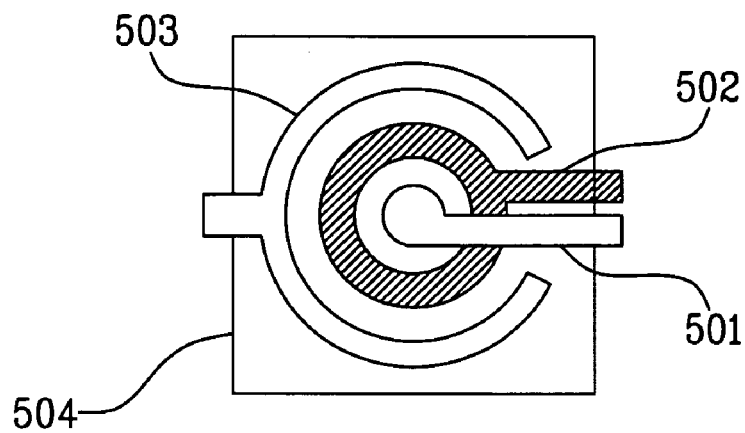
FIG. 2A is a top view of another related art TFT.
Figure 2B:
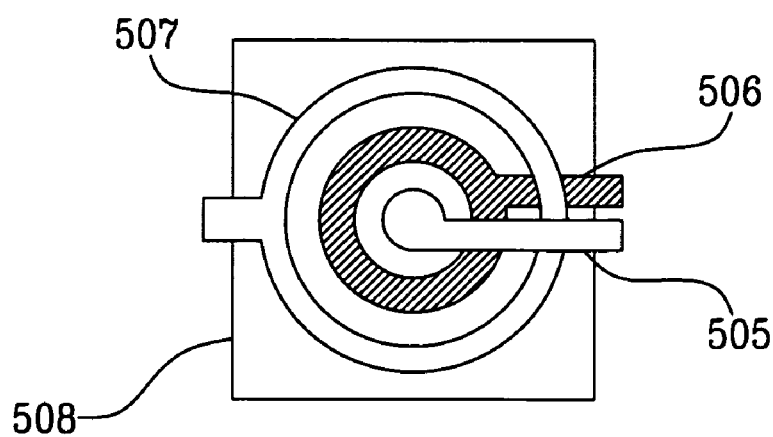
FIG. 2B is a top view of yet another related art TFT.
Figure 3A:
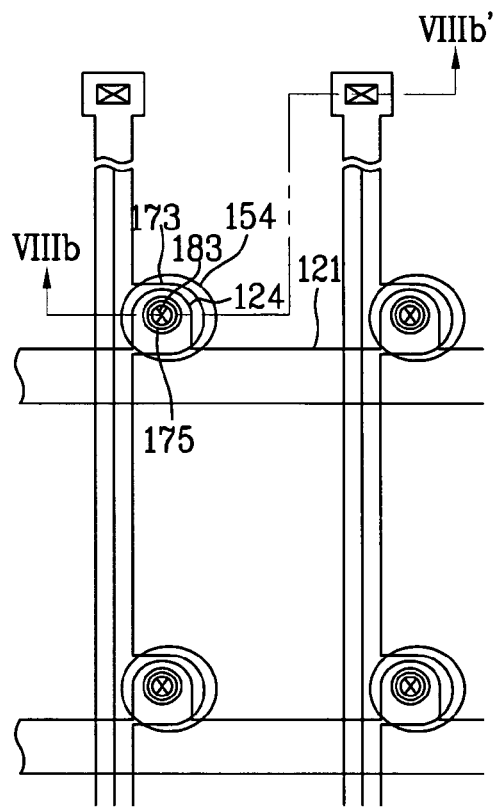
FIG. 3A is a schematic view of a related art TFT disposed in a display panel.
Figure 3B:
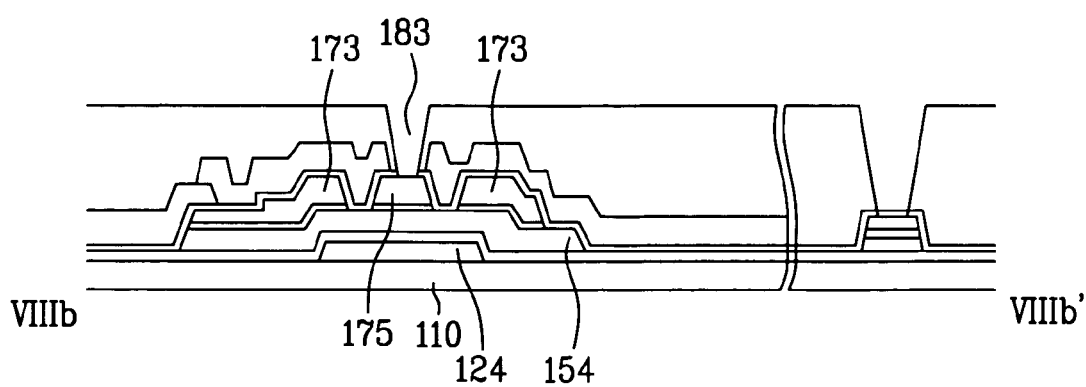
FIG. 3B is a sectional view taken along the line VIIIb-VIIIb' of FIG. 3A.

Reference will now be made in detail to an embodiment of the present invention, example of which is illustrated in the accompanying drawings.

The area of the effective stray capacitance is calculated by Equation 1 below.

$$S = \pi \times ((d+L)/2) \times ((d+L)/2) \quad \text{[Equation 1]}$$

Here, d denotes a diameter of the source electrode of the TFT, L denotes a length of a channel of the TFT (with reference to FIG. 4A), and S denotes the area of the effective stray capacitance.

When the area (S) of the effective stray capacitance reaches approximately 150 m$^2$, a level shift of the electric potential of a display electrode occurs, and flickering of an image or an after-image occurs.

The above values of the equation 1 are selected so that the area (S) of the effective stray capacitance is less than approximately 150 μm$^2$.

In order to set an ON current, the ratio of a width of the channel to a length of the channel length is used. The respective values are selected so that the ratio of the width of the channel to the length of the channel is more than approximately 4.5. The ratio of the width of the channel to the length of the channel is calculated by Equation 2 below.

$$W/L = \pi \times (d/L + 1) \quad \text{[Equation 2]}$$

Here, W denotes the width of the channel of the TFT, and L denotes the length of the channel of the TFT.

The source and drain electrodes have concentric circular shapes, thereby reducing a leakage current. Further, the source electrode has a large diameter, thereby increasing an ON current.

However, the increase of the ON current increases the area (S) of the effective stray capacitance between the gate and drain electrodes, which is calculated by Equation 1, thereby causing the amount of the level shift to reach an undesirable level.

Accordingly, the filling capacity index to the effective stray capacitance is calculated by below Equation 3 below.

$$F = S \div (W/L) \quad \text{[Equation 3]}$$

Here, F denotes the filling capacity index to the effective stray capacitance.

The filling capacity index to the effective stray capacitance may be small. When the filling capacity index to the effective stray capacitance exceeds approximately 50, the amount of electric charges filling the effective stray capacitance remarkably influences the amount of the level shift. Accordingly, the respective values are selected so that the filling capacity index to the effective stray capacitance is less than approximately 50, thereby removing the influence of the amount of electric charge filling the effective stray capacitance on the ON current and the level shift.

The values required by the Equations 1 to 3 are selected so that the above-mentioned problems are avoided. Table 1 states the obtained results.

TABLE 1

| d; L; μm μm | 3 | 4 | 5 | 6 | 8 | 10 |
|---|---|---|---|---|---|---|
| 0  W/L | 1π | 1π | 1π | 1π | 1π | 1π |
| S | 2.25π | 4π | 6.25π | 9π | 16π | 25π |

TABLE 1-continued

| d; L; μm μm | | 3 | 4 | 5 | 6 | 8 | 10 |
|---|---|---|---|---|---|---|---|
| 3 | W/L | 2π | 1.75π | 1.6π | 1.5π | 1.375π | 1.3π |
|   | S | 9π | 12.25π | 16π | 20.25π | 30.25π | 42.25π |
| 5 | W/L | 2.67π | 2.25π | 2π | 1.83π | 1.625π | 1.5π |
|   | S | 16π | 20.25π | 25π | 30.25π | 42.25π | 56.25π |
| 8 | W/L | 3.66π | 3π | 2.6π | 2.33π | 2π | 1.8π |
|   | S | 30.25π | 36π | 42.25π | 49π | 64π | 81π |
| 10 | W/L | 4.33π | 3.5π | 3π | 2.66π | 2.25π | 2π |
|    | S | 42.25π | 49π | 56.25π | 64π | 81π | 100π |
| 12 | W/L | 5π | 4π | 3.4π | 3π | 2.5π | 2.2π |
|    | S | 56.25π | 64π | 72.25π | 81π | 100π | 121π |
| 14 | W/L | 5.67π | 4.5π | 3.8π | 3.33π | 2.75π | 2.4π |
|    | S | 72.25π | 81π | 91.25π | 100π | 121π | 144π |
| 16 | W/L | 6.33π | 5π | 4.2π | 3.66π | 3π | 2.8π |
|    | S | 90.25π | 100π | 110.25π | 121π | 144π | 169π |
| 18 | W/L | 7π | 5.5π | 4.6π | 4π | 3.25π | 2.8π |
|    | S | 110.25π | 121π | 132.25π | 144π | 169π | 196π |

Here, 0 is applied to the value of d so as to represent a limit value.

In Table 1, the vertical line defines the diameter (d) of the source electrode and the horizontal line defines the length (L) of the channel, thereby calculating the values of W/L and S.

In Table 1, the values in dark columns are values obtained from examples, that did not achieve the advantages of the present invention, and the values in light and white columns are values obtained from examples, which achieved the advantages of the present invention.

TFTs having the values in the light columns are suitable for a liquid crystal display device having a relatively small-sized screen, such as a personal computer or a monitor, and TFTs having the values in the white columns are suitable for a liquid crystal display device having a relatively large-sized screen, such as a liquid crystal TV.

A TFT, that may be a bottom gate type TFT, will be described.

Figure 4A:
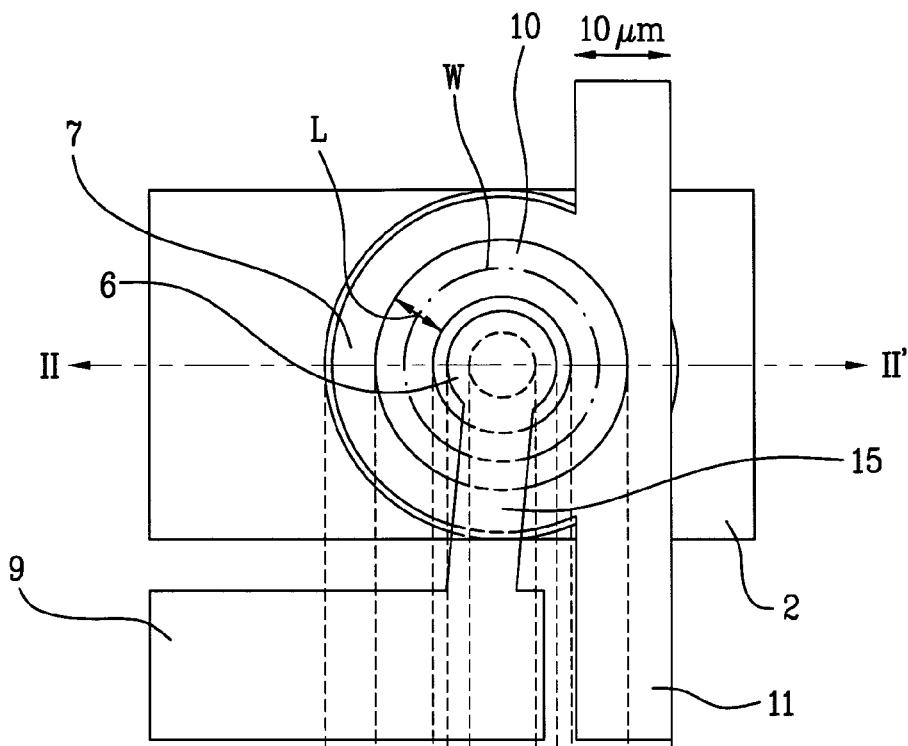
FIG. 4A is a top view of a TFT in accordance with one exemplary embodiment of the present invention.
Figure 4B:
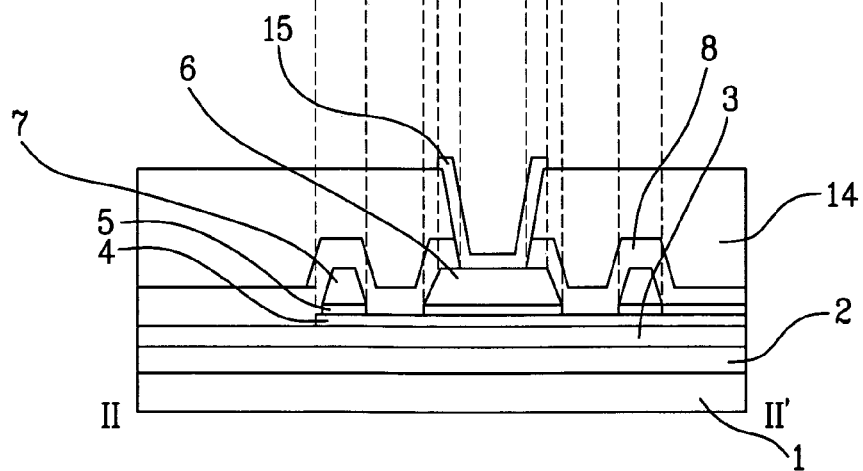
FIG. 4B is a sectional view taken along the line II-II' of FIG. 4A.

FIG. 4A is a top view of a TFT in accordance with an exemplary embodiment of the present invention, and FIG. 4B is a sectional view taken along the line II-II' of FIG. 4A.

As shown in FIG. 4B, a gate electrode and wiring layer 2, which may be made of MoW, is grown on a substrate 1. The gate electrode and wiring layer 2 may be grown by sputtering. A transparent substrate made of glass or a transparent or opaque substrate made of plastic or ceramic may be used as the substrate 1.

Then, the gate electrode and wiring layer 2, that may be made of MoW, is selectively removed by a photo etching process (PEP). Thereby, the gate electrode and wiring layer 2 has an electrode shape that may have a width of 30 μm. Here, the gate electrode and wiring layer 2 which may be made of MoW employs a related art chemical dry etching technique.

Further, a SiOx layer (not shown) having a thickness of 200 nm, may be formed between the substrate 1 and the gate electrode and wiring layer 2 by Plasma Enhanced Chemical Vapor Deposition (PECVD).

Figure 5:
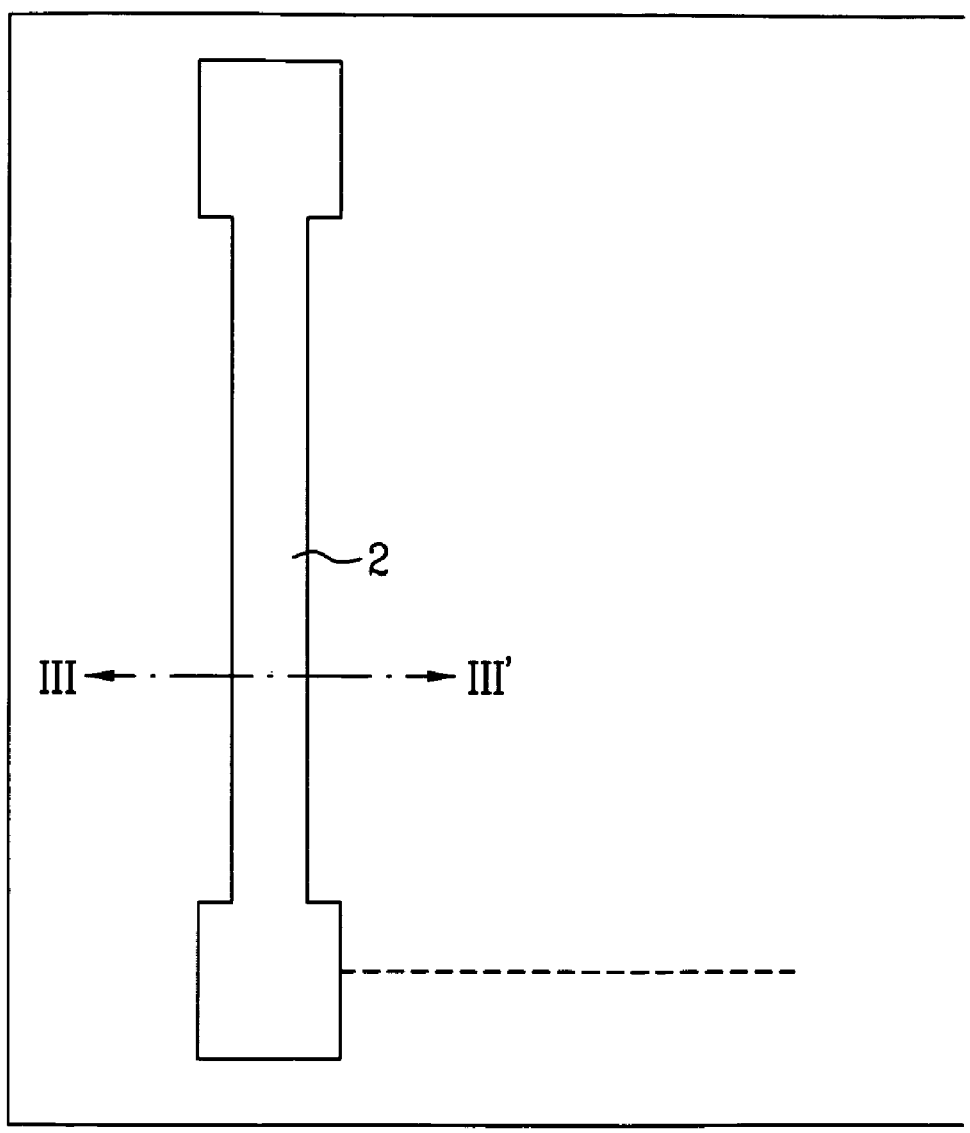
FIG. 5 is a schematic top view illustrating disposition of a gate electrode and wiring layer.

FIG. 5 is a schematic top view illustrating disposition of the above gate electrode and wiring layer 2. A gate insulating layer 3 made of SiOx and having a thickness of 250 nm may be formed on the substrate 1 including the gate electrode and wiring layer 2 by PECVD.

Thereafter, an intrinsic amorphous silicon (I○a-Si:H) layer 4 for the TFT channels having a thickness of 180 nm and an n+ amorphous silicon (n+○a-Si:H) layer 5 for ohmic contacts having a thickness of 50 nm are continuously formed on the gate insulating layer 3 using the PECVD.

Figure 6:
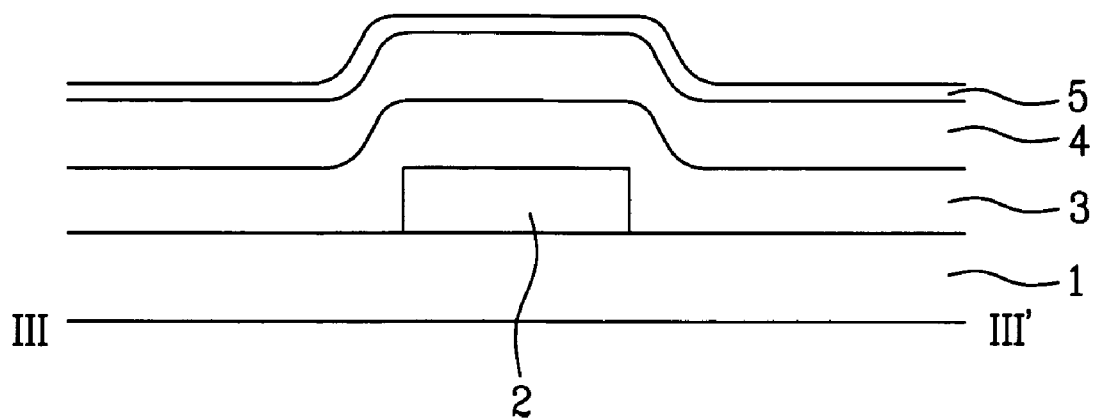
FIG. 6 is a sectional view taken along the line III-III' of FIG. 5, illustrating configuration of various layers formed on the gate electrode.

FIG. 6 is a sectional view taken along the line III-III' of FIG. 5, illustrating configuration of various layers formed on the gate electrode.

Figure 7:
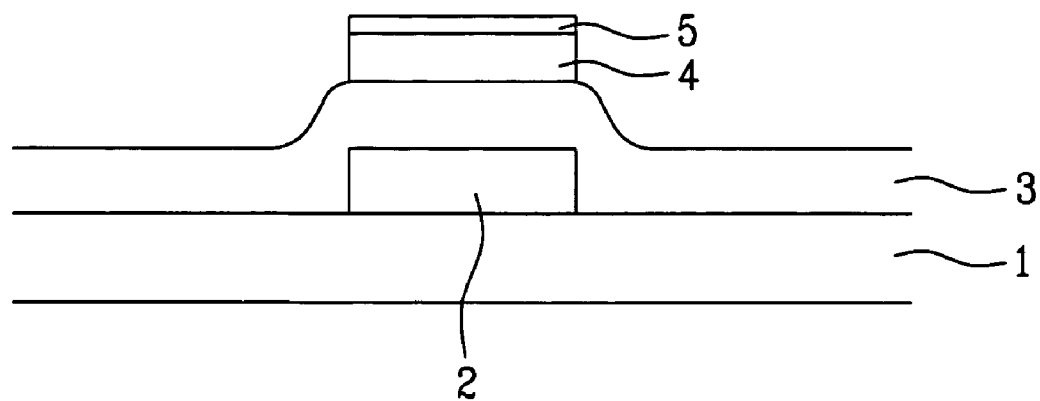
FIG. 7 is a schematic sectional view of a silicon island.

A silicon island comprising the intrinsic amorphous silicon (I○a-Si:H) layer 4 and the n+ amorphous silicon (n+○a-Si:H) layer 5 is formed on the gate insulating layer 3, using a photo etching process and the related art chemical dry etching technique. FIG. 7 is a sectional view of the silicon island.

Figure 8:
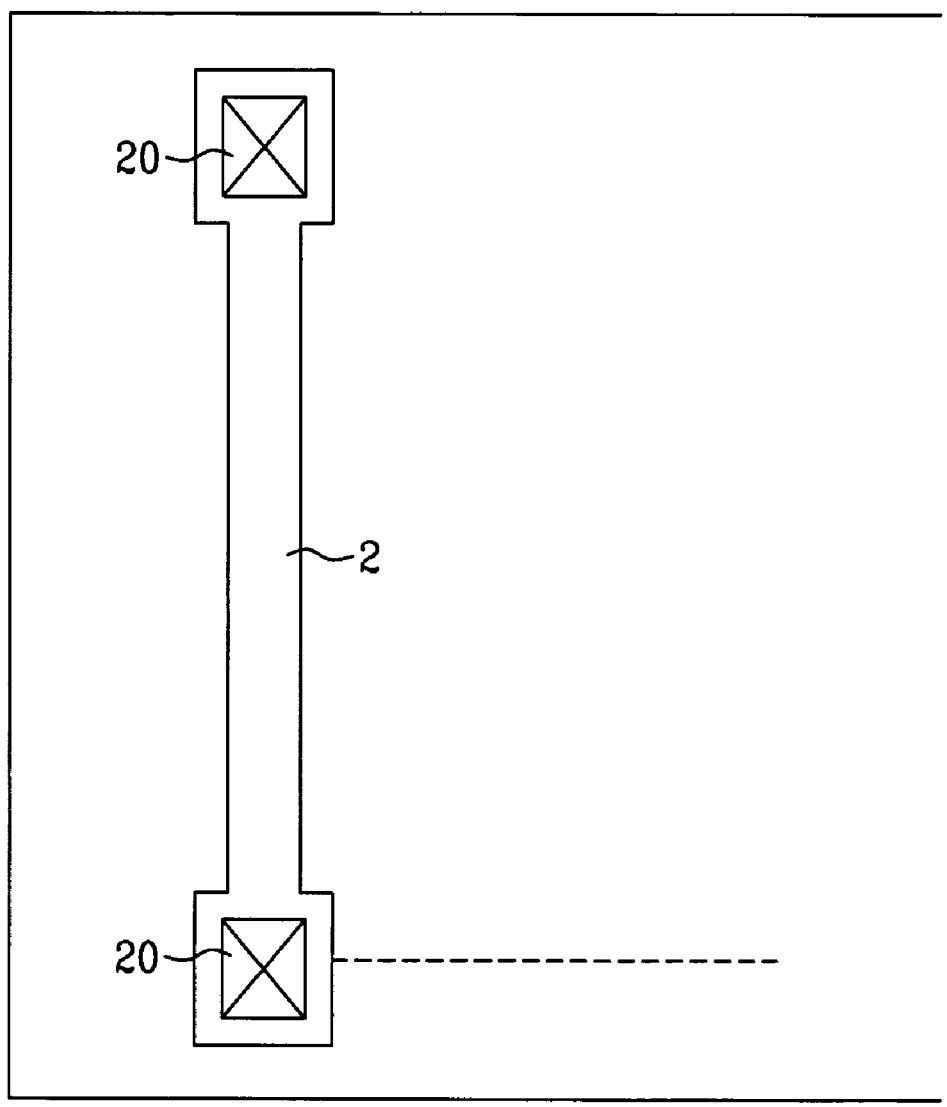
FIG. 8 is a schematic top view illustrating disposition of contact holes.

Then, contact holes 20, shown in FIG. 8, which are connected to ICs for driving gate electrodes, are formed through terminal portions of the gate electrode and wiring layer 2 by the photo etching process. FIG. 8 is a schematic top view illustrating disposition of the contact holes 20.

Thereafter, a Mo layer having a thickness of 30 nm, an Al layer having a thickness of 300 nm, and a Mo layer having a thickness of 20 nm may be sequentially grown on the substrate 1 including the silicon islands by sputtering.

Then, source and drain electrodes 6 and 7, signal line 11, gate line connection terminals 21 on the contact holes 20, and signal line connection terminals 22 may be formed by the photo etching process.

Figure 9:
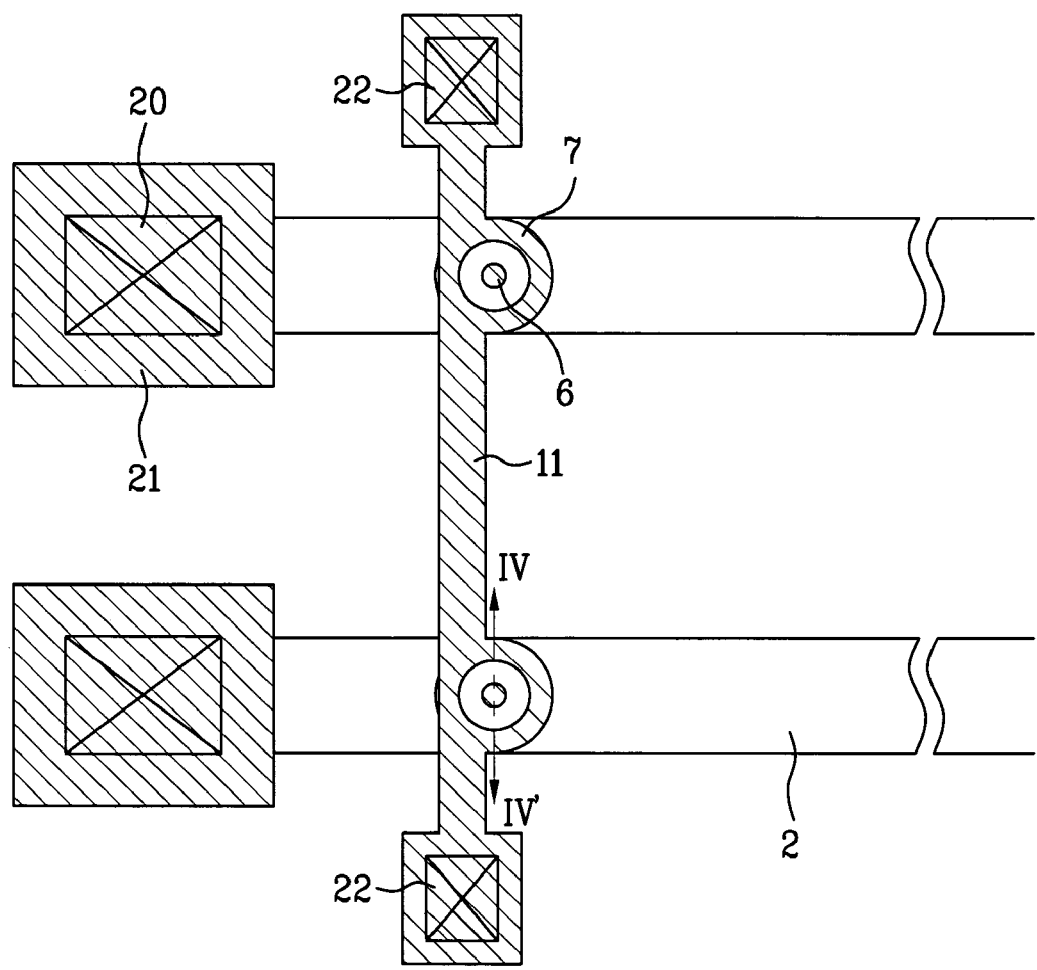
FIG. 9 is a schematic top view illustrating disposition of source and drain electrodes and a signal line formed on the gate electrode.

As shown in FIGS. 4A and 9, the source and drain electrodes 6 and 7 have circular shapes. More specifically, the source electrode 6, that may have a diameter (d) of 10 μm, is disposed at the center, and the drain electrode 7, that may have a width of 4 μm and a concentric shape with that of the source electrode 6, surrounds the source electrode 6 when a channel region 10 having a width (L) of 5 μm is interposed between the source electrode 6 and the drain electrode 7.

The signal line 11 may has a width of 10 μm, and the drain electrode 7 may be located at a region of 1 μm inwardly from the silicon island.

FIG. 9 is a schematic top view illustrating disposition of the source and drain electrodes 6 and 7 and the signal line 11 formed on the gate electrode 2.

Figure 10:
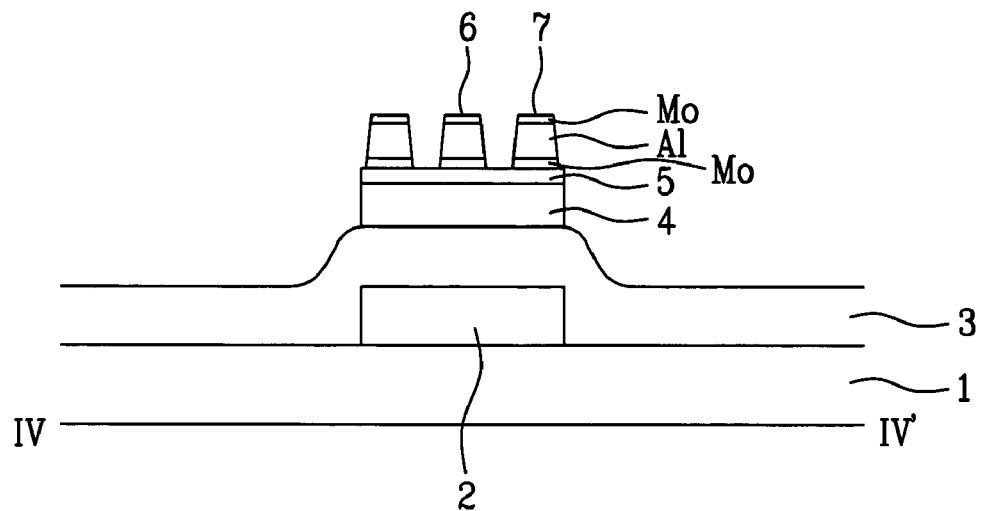
FIG. 10 is sectional view taken along the line IV-IV' of FIG. 9.

FIG. 10 is sectional view taken along the line IV-IV' of FIG. 9.

When values of respective elements of the TFT manufactured by the above method are applied to the above first to third equations, the area (S) of the effective stray capacitance is 56.25π, i.e., 177 μm², from the first equation. Also, the ratio (W/L) of the width of the channel to the length of the channel is 9.4 from the second equation and the filling capacity index (F) is 18.8 from the third equation.

Further, the total area of the TFT is 700 μm².

Figure 11:
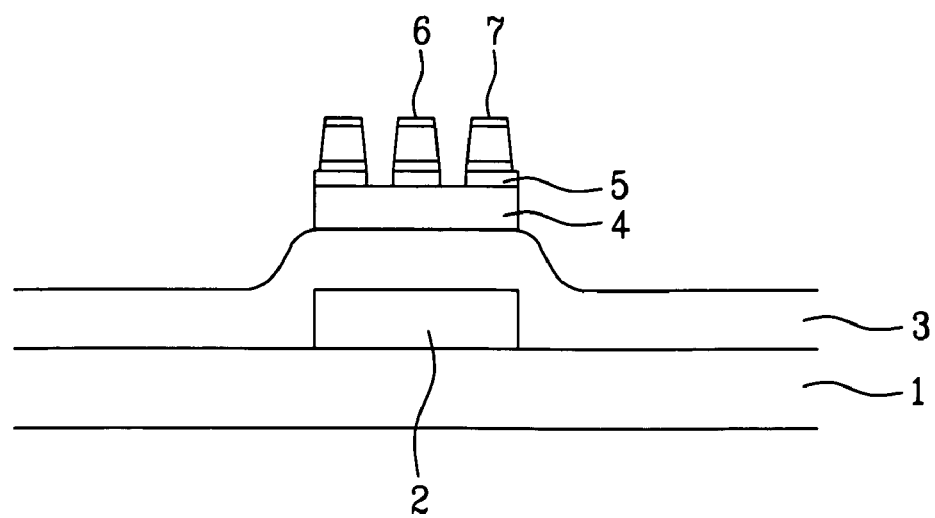
FIG. 11 is a sectional view of a structure after dry etching.

Thereafter, using the source and drain electrodes 6 and 7 as a mask, a portion of the n+ amorphous silicon (n+○a-Si:H) layer 5 corresponding to the channel region 10 is removed by etching. A portion of the intrinsic amorphous silicon (I○a-Si:H) layer 4 corresponding to the removed portion of the n+ amorphous silicon (n+○a-Si:H) layer 5 is partially removed by etching. That is, approximately 30 nm of the portion of the intrinsic amorphous silicon (I○a-Si:H) layer 4 is removed. FIG. 11 is a sectional view of the structure after dry etching.

Thereafter, an interlayer insulating film 12 made of SiN and having a thickness of 400 nm is formed on the structure of FIG. 11 by the PECVD. In order to improve planarity of the interlayer insulating film 12, a transparent organic resin layer 14 having a thickness of approximately 1 μm is formed on protrusions of the interlayer insulating film 12.

Then, a contact hole 13, which is connected to a part of the upper surface of the source electrode 6, and the contact holes 20, which are connected to the gate and signal line connection terminals 21 and 22, as shown in FIG. 9, are formed through the interlayer insulating film 12 and the transparent organic resin layer 14.

Figure 12:
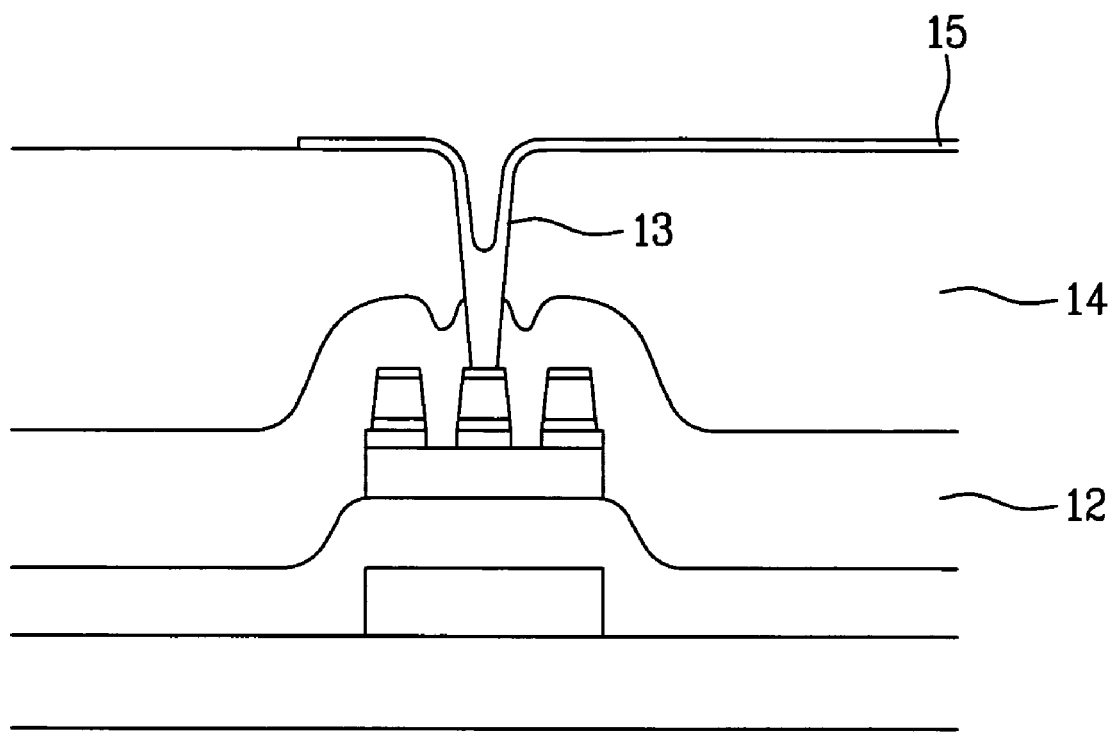
FIG. 12 is a sectional view of a completed TFT in accordance with an exemplary embodiment of the present invention.

An ITO layer having a thickness of 50 nm is grown on the transparent organic resin layer 14 by sputtering, and an ITO display electrode 9 and an ITO source line 15 are formed by the photo etching process. FIG. 12 is a sectional view of a completed TFT in accordance with this exemplary embodiment of the present invention.

Figures 13A, 13B:
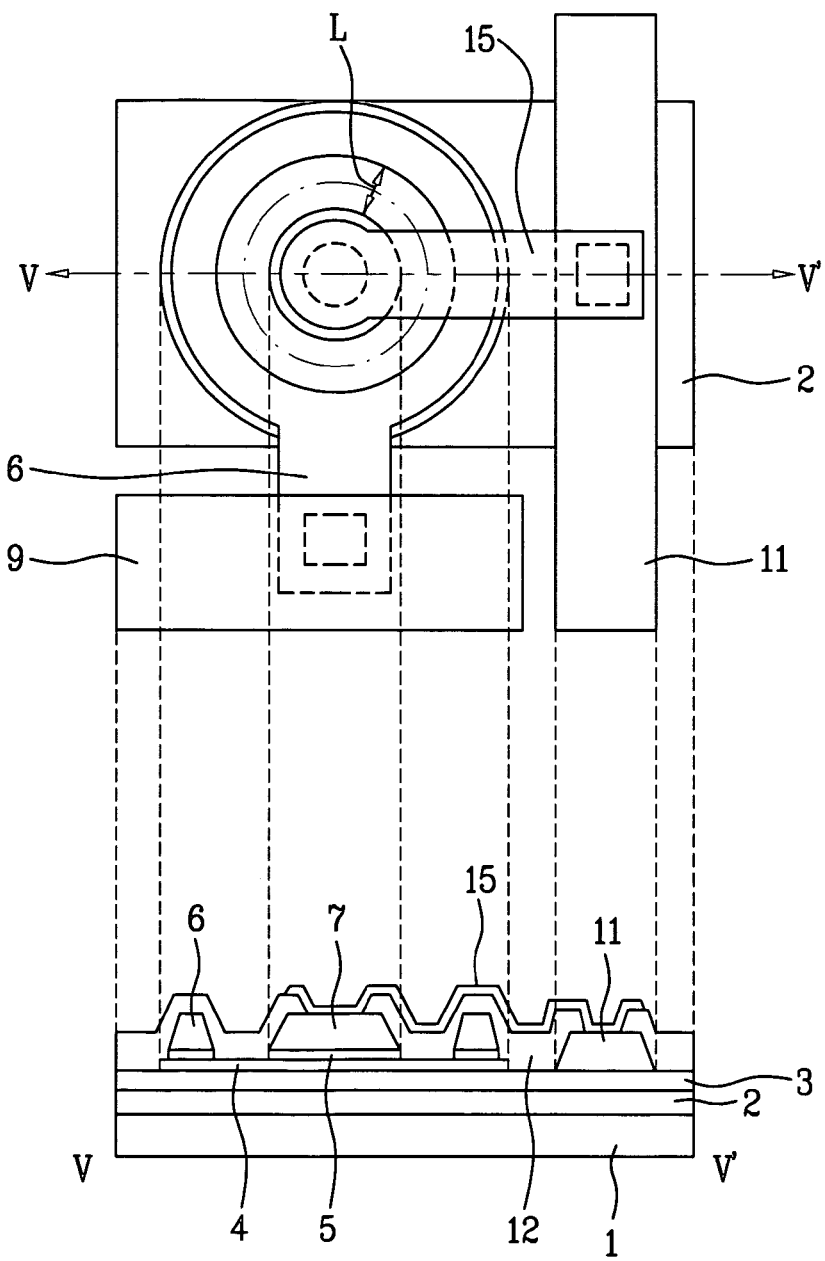
FIG. 13A is a top view of a TFT in accordance with another exemplary embodiment of the present invention.
FIG. 13B is a sectional view taken along the line V-V' of FIG. 13A.

Another exemplary embodiment of the present invention will be described. FIG. 13A is a top view of a TFT in accordance with another exemplary embodiment of the present invention, and FIG. 13B is a sectional view taken along the line V-V' FIG. 13A. The TFT of this embodiment does not employ a transparent organic resin layer.

The TFT of this embodiment is manufactured by the same method as the TFT of the first embodiment except that drain and source electrodes 6 and 7 having concentric circular shapes are formed such that the drain electrode 7 is disposed at the center and the source electrode 6 surrounds the drain electrode 7. A signal line 11 is disposed separately from the drain and source electrodes 6 and 7 and is connected to the drain electrode 7, and an ITO display electrode 9 is connected to the source electrode 6.

In the TFT of this embodiment, the length (L) of a channel may be 5 μm, the width (W) of the channel may be 47 μm, the ratio (W/L) of the width of the channel to the length of the channel may be 9.4, and the area (S) of an effective stray capacitance may be 380 μm².

REFERENCE EMBODIMENT

Figure 14A:
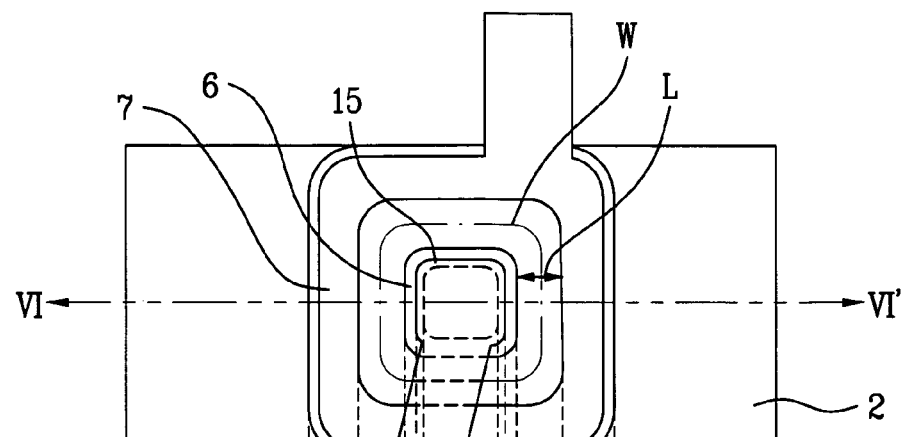
FIG. 14A is a top view of a TFT in accordance with a reference embodiment.
Figure 14B:
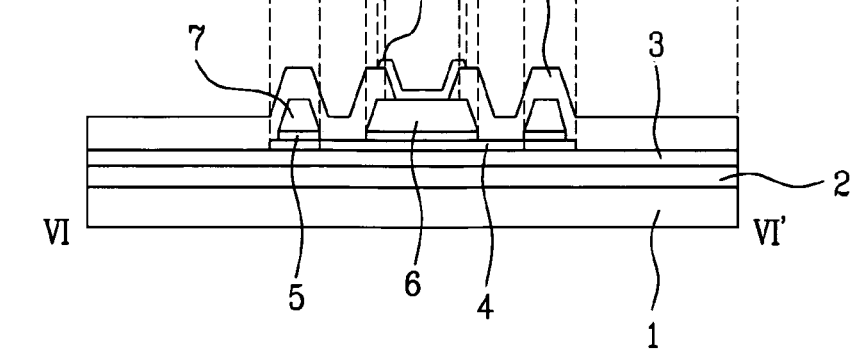
FIG. 14B is a sectional view taken along the line VI-VI' of FIG. 14A.

Further, as shown in FIGS. 14A and 14B, a TFT of the reference embodiment is manufactured by the same method as the TFT of the first embodiment except that each of electrodes has a rectangular shape.

In the TFT of the reference embodiment, the length (L) of a channel may be 5 μm, the width (W) of the channel may be 60 μm, the ratio (W/L) of the width of the channel to the length of the channel may be 12, the total area of the TFT may be 600 μm², and the area (S) of an effective stray capacitance may be 225 μm².

The TFTs of the respective embodiments and the reference embodiment employ a structure in which a gate line and a gate electrode are formed in the same layer. Thereby, when gate line resistance is the same when considering the size of a screen and the number of pixels, the gate line is not limited to a rectangular shape having the same width, but may have different widths.

As apparent from the above description, the present invention provides a TFT, which reduces a leakage current, increases an ON current, and reduces an amount of level shift. The present invention also provides a method for manufacturing a liquid crystal display device using the TFT.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A TFT comprising:
   a gate electrode formed on a substrate; and
   source and drain electrodes obtained by sequentially forming a gate insulating film, an intrinsic amorphous silicon layer, and an n+ amorphous silicon layer on the gate electrode,
   wherein the source and drain electrodes have concentric shapes, and
   wherein an area of an effective stray capacitance is less than 150 μm².

2. The TFT as set forth in claim 1, wherein the source and drain electrodes have circular shapes and one of the source and drain electrodes is disposed at the center, and the other one of the source and drain electrodes has a concentric circular shape for surrounding the one of the source and drain electrodes.

3. The TFT as set forth in claim 2, further comprising:
   a channel region formed between the source and drain electrodes.

4. The TFT as set forth in claim 3, wherein a ratio of a width of the channel region to a length of the channel region is more than 4.5.

5. The TFT as set forth in claim 2, wherein a filling capacity index to the effective stray capacitance is less than 50.

6. The TFT as set forth in claim 1, wherein the area of the effective stray capacitance is calculated by Equation of $\pi \times ((d+L)/2) \times ((d+L)/2)$, wherein d denotes a diameter of the source electrode of the TFT and L denotes a length of a channel of the TFT.

7. The TFT as set forth in claim 4, wherein the ratio of the width of the channel to the length of the channel is calculated by Equation of $\pi \times (d/L+1)$, wherein d denotes a diameter of the source electrode of the TFT and L denotes a length of a channel of the TFT.

8. The TFT as set forth in claim 5, wherein the filling capacity index to the effective stray capacitance is calculated by Equation of $S \div (W/L)$, wherein S denotes an area of an effective stray capacitance between the gate and drain electrodes, W denotes the width of the channel of the TFT, and L denotes the length of the channel of the TFT.

9. The TFT as set forth in claim 1, further comprising a transparent inorganic insulating film made of SiOx formed between the substrate and the gate electrode.

10. A liquid crystal display device, in which display cells are disposed in a matrix, comprising liquid cells, each having the TFT as set forth in claim 1.

* * * * *